United States Patent
Jabbour et al.

(10) Patent No.: US 12,271,115 B2
(45) Date of Patent: Apr. 8, 2025

(54) METHOD TO DETECT A DEFECT ON A LITHOGRAPHIC SAMPLE AND METROLOGY SYSTEM TO PERFORM SUCH A METHOD

(71) Applicant: Carl Zeiss SMT GmbH, Oberkochen (DE)

(72) Inventors: Toufic Jabbour, Aalen (DE); Lars Omlor, Pleasanton, CA (US)

(73) Assignee: Carl Zeiss SMT GmbH, Oberkochen (DE)

(*) Notice: Subject to any disclaimer, the term of this patent is extended or adjusted under 35 U.S.C. 154(b) by 209 days.

(21) Appl. No.: 17/684,913

(22) Filed: Mar. 2, 2022

(65) Prior Publication Data
US 2022/0283513 A1 Sep. 8, 2022

Related U.S. Application Data (60) Provisional application No. 63/155,887, filed on Mar. 3, 2021.

(30) Foreign Application Priority Data

Mar. 23, 2021 (DE) .......................... 102021202823.3

(51) Int. Cl.
*G03F 7/00* (2006.01)
*G01N 21/95* (2006.01)
(Continued)

(52) U.S. Cl.
CPC ..... *G03F 7/70591* (2013.01); *G01N 21/9501* (2013.01); *G03F 7/7065* (2013.01); *G06T 7/001* (2013.01); *G01N 2021/95676* (2013.01)

(58) Field of Classification Search
CPC ...... G03F 7/70591; G03F 7/7065; G03F 1/84; G01N 21/9501; G01N 2021/95676; G01N 21/956
See application file for complete search history.

(56) References Cited

U.S. PATENT DOCUMENTS 7,812,943 B2   10/2010  Silver et al.
7,817,844 B2 * 10/2010  Kitamura ............. G06T 7/0004
                                                382/199
(Continued)

FOREIGN PATENT DOCUMENTS

JP   2001-228050   8/2001
JP   2007-057705   3/2007

OTHER PUBLICATIONS

The Office Action issued by the German Patent Office for Application No. DE 10 2021 202 823.3, dated Dec. 21, 2021 (With English Translation).

(Continued)

Primary Examiner — Hung V Nguyen
(74) Attorney, Agent, or Firm — Fish & Richardson P.C.

(57) ABSTRACT

A method to detect a defect on a lithographic sample includes the following steps: detection light and a detector having at least one sensor pixel are provided. Further, a detection pattern is provided causing a light structure of the detection light being structured at least along one dimension (1D, x). The detection pattern is aligned such that the detector is aligned normal to an extension (xy) of the light structure. Further, a complimentary pattern is provided having a 1D structure which is complimentary to that of the detection pattern. The sample is moved relative to the detection pattern while gathering the detection light on the detector. Further, a reference sample without defects or with negligible defects is provided. The reference sample also is moved relative to the detection pattern while gathering the detection light on the detector. A defect ($S_1$ to $S_4$) localization on the sample is decoded by correlation using the complementary pattern. Using such defect detection method improves a signal-to-noise ratio.

20 Claims, 4 Drawing Sheets

(51) Int. Cl.
  *G06T 7/00*   (2017.01)
  *G01N 21/956*  (2006.01)

(56) References Cited

U.S. PATENT DOCUMENTS

| | | | |
|---|---|---|---|
| 9,401,014 B2 * | 7/2016 | Zafar | G06F 30/398 |
| 10,572,990 B2 * | 2/2020 | Yoshitake | G06T 7/001 |
| 2006/0018530 A1 * | 1/2006 | Oaki | G06T 7/001 |
| | | | 382/144 |

OTHER PUBLICATIONS

Barnes et al., "Three-dimensional deep sub-wavelength defect detection using λ-193 nm optical microscopy", *Optics Express*, vol. 21, No. 22, pp. 26219-26226 (Nov. 4, 2013).

Busboom et al., "Uniformly Redundant Arrays", *Experimental Astronomy* 8, pp. 97-123 (1998).

Zhou et al., "Detecting 20 nm Wide Defects in Large Area Nanopatterns Using Optical Interferometric Microscopy", *Nano Letters*, vol. 13, pp. 3716-3721 (2013).

* cited by examiner

METHOD TO DETECT A DEFECT ON A LITHOGRAPHIC SAMPLE AND METROLOGY SYSTEM TO PERFORM SUCH A METHOD

CROSS-REFERENCE TO RELATED APPLICATION

This application claims priority under 35 USC § 119 to U.S. provisional patent application 63/155,887, filed on Mar. 3, 2021, and German patent application 10 2021 202 823.3, filed on Mar. 23, 2021. The entire contents of each of these priority applications are incorporated herein by reference.

TECHNICAL FIELD

The invention relates to a method to detect a defect on a lithographic sample, i.e. a mask blank or a structured wafer. Further, the invention relates to a metrology system to perform such a method.

BACKGROUND

The detection of nanoscale imperfections or defects on a lithographic sample is of critical importance to high-volume semiconductor manufacturing. A defect buried in a nanopattern can substantially affect the functionality of the whole device. Thus, detecting defects during nanofabrication is critical for maintaining a high yield. Current optical inspection technologies are challenged as critical dimensions (CDs) of the structures of the lithographic sample drop below e.g. 20 nm. A scattered intensity from such diminished defect dimensions is low and it becomes difficult to discern between the defect signal and the instrument noise.

A method of defect detection on a nanoscale is disclosed in U.S. Pat. No. 7,812,943 B2 and in B. M. Barnes et al., Optics Express 21 (22), pp. 26219-26226 (2013). These documents disclose techniques which are known as through-focus scanning optical microscopy and scattered-field optical microscopy. Another technique for defect localization is diffractive phase optical interferometric microscopy, disclosed in R. Zhou et al., Nano Lett. 13, pp. 3716-3721 (2013).

SUMMARY

An aspect of the present invention is to further improve a signal to noise ratio of a method to detect a defect on a lithographic sample, for example, by using the following steps: providing detection light and a detector with at least one sensor pixel; providing a detection pattern (P) causing a light structure of the detection light being structured at least along one dimension (1D, x); aligning the detection pattern (P) such that the detector is aligned normal to an extension (xy) of the light structure; providing a complimentary pattern ($\tilde{P}$) which has a 1D structure which is complementary to that of the detection pattern (P); moving the sample relative to the detection pattern (P) while gathering the detection light on the detector; providing a reference sample without defects or with negligible defects; moving the reference sample relative to the detection pattern (P) while gathering the detection light on the detector; and decoding a defect ($s_1$ to $s_4$) localization on the sample by correlation using the complementary pattern ($\tilde{P}$).

According to the invention, it has been recognized that using a reference sample on the one hand and further using a decoding step by correlation using a complementary pattern helps to amplify the desired defect signal with respect to a noise signal. A good signal to noise ratio with respect to the desired defect signal results.

The detector may be embodied as a single pixel sensor or alternatively as a sensor pixel array extending at least in one dimension (1D) or in two dimensions (2D). The detector may be a CCD array or a CMOS array.

Alignment of the detection pattern such that the detector is aligned normal to an extension of the light structure ensures that light emanating from the detection pattern is received by the detector. The detection pattern may be a one-dimensional (1D) or a two-dimensional (2D) detection pattern. In cases of a 2D detection pattern, a 2D defect distribution on the sample may be detected requiring a movement of the sample relative to the detection pattern in two dimensions, in particular a two-dimensional scanning movement. Uniformly redundant arrays which may be used as 1D/2D detection patterns are known from A. Busboom et al. Experimental Astronomy 8: 97-123, 1998.

The method can be performed using coherent and/or partially coherent detection light.

For example, the decoding step is done using a filtering algorithm. A matched filtering is done by correlating a known signal, i.e. the complementary pattern, with an unknown signal, i.e. the defect signal to be detected coded with a detection pattern, to detect the presence of a pattern, i.e. the defect signal, in the unknown signal.

Such filtering algorithm allows a high signal to noise ratio depending on the quality of the approximation of a convolution of the detection pattern with the complementary pattern to a delta distribution.

For example, the provision of the detection pattern (P) is done via a structured mask showing a model of the detection pattern as a mask pattern having pattern areas transmitting the detection light and pattern areas blocking the detection light. Providing the detection pattern via the structured mask can be done with sufficient accuracy. The structured mask may result in a binary detection pattern causing a detection light structure by changing the detection light intensity between "no detection light" and "full detection light intensity". Alternatively, the detection pattern may be not binary and may include further e.g. staggered detection light levels, i.e. more than two different intensities, e.g. 50%, 25%, 75% of the maximum intensity, and/or may include intensity grey levels continuously changing between no intensity and full detection light intensity.

For example, the provision of the detection pattern (P) is done via a structured illumination of the sample with the detection light. Providing the detection pattern via the structured illumination is an alternative allowing an omission of a structured mask. Such structure illumination may be realized via an interference pattern, in particular via diffraction.

In some examples, during the moving, the sample is periodically shifted. The periodical shift of the sample gives a favorable control of correlation properties.

In some examples, during the moving, the sample is aperiodically shifted. The aperiodic shifting of the sample in certain cases gives sufficient accuracy.

For example, a metrology system to perform a method to detect a defect on a lithographic sample is provided. The method includes: providing detection light and a detector with at least one sensor pixel; providing a detection pattern (P) causing a light structure of the detection light being structured at least along one dimension (1D, x); aligning the detection pattern (P) such that the detector is aligned normal to an extension (xy) of the light structure; providing a complimentary pattern ($\tilde{P}$) which has a 1D structure which is complementary to that of the detection pattern (P); moving the sample relative to the detection pattern (P) while gathering the detection light on the detector; providing a reference sample without defects or with negligible defects; moving the reference sample relative to the detection pattern (P) while gathering the detection light on the detector; and decoding a defect ($s_1$ to $s_4$) localization on the sample by correlation using the complementary pattern ($\tilde{P}$). The metrology system includes a detection light source, a detector with at least one sensor pixel, means to produce a detection pattern (P) causing a light structure of the detection light being structured at least along 1D, having a sample stage to move a sample held with the sample stage relative to the detection pattern, and a decoding module to detect a defect ($s_1$ to $s_4$) localization on the sample by a correlation using a complimentary pattern ($\tilde{P}$). The advantages of the metrology system correspond to those discussed above with respect to the detection method. Depending on the metrology system setup, a 1D and/or a 2D detection pattern may be utilized. The sample stage may have drives to allow a 1D movement and/or a 2D movement of the sample in a respective sample stage plane. The sensor pixel may be realized as a photodiode or as a CMOS or CCD sensor.

For example, the detector has a sensor pixel array extending at least in 1D. The sensor pixel array allows the utilization of a 2D detection pattern and a 2D measurement while moving the sample relative to the detection pattern only along one dimension. Alternatively, also a 2D scanning movement is possible.

The sensor pixel array may extend in two dimensions and may be realized as a CMOS or as a CCD sensor array. The metrology system may be embodied such that the sample or a sample region is imaged to the detector.

For example, the detection pattern is produced via the mask pattern of a structured mask. For example, the detection pattern (P) is produced via a structured illumination of a sample with the detection light. The advantages of a metrology system having the above features correspond to those of the method wherein the provision of the detection pattern (P) is done via a structured mask showing a model of the detection pattern as a mask pattern having pattern areas transmitting the detection light and pattern areas blocking the detection light, and the method wherein the provision of the detection pattern (P) is done via a structured illumination of the sample with the detection light.

BRIEF DESCRIPTION OF DRAWINGS

Exemplary embodiments are described hereinafter with respect to the enclosed drawings. It shows.

DETAILED DESCRIPTION

Figure 1:
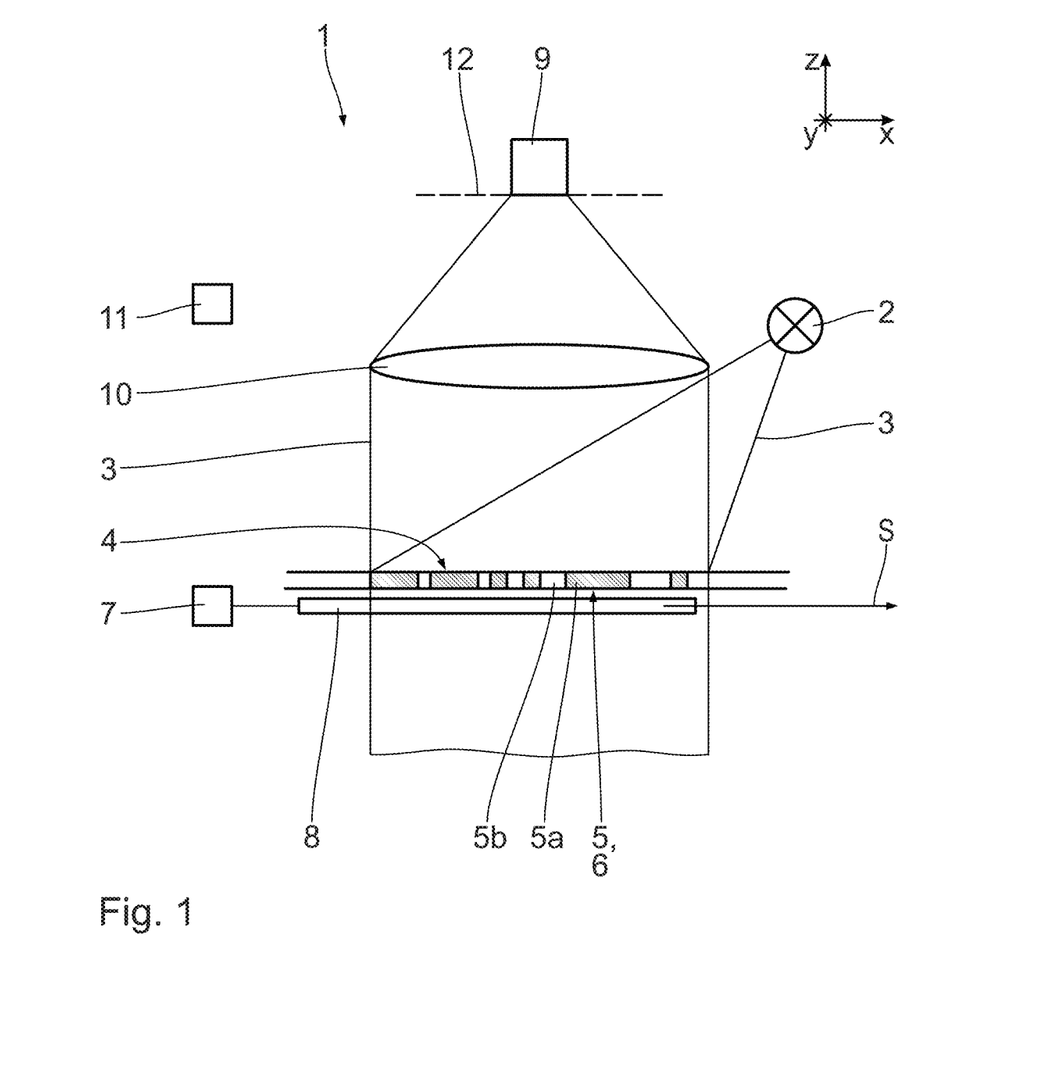
FIG. 1 a schematical layout of a metrology system for defect detection on lithographic samples, shown in a meridional section view.

FIG. 1 shows in a meridional view a layout and a beam path of a metrology system 1. The metrology system 1 is capable to perform a defect detection method to detect at least one defect or multiple defects on a lithographic sample, e.g. a mask blank or a structured reticle or wafer.

In the following, a Cartesian coordinate system xyz is used to facilitate the description of orientations and directions of the components of the metrology system 1. In FIG. 1, the x-direction runs horizontally to the right. The y-direction is along the direction of view perpendicular to the drawing plane. The z-direction runs vertically in FIG. 1.

The metrology system 1 includes a detection light source 2 producing detection light 3. A wavelength of the detection light 3 may be an EUV wavelength in the range e.g. between 5 nm and 30 nm or may be a larger VUV, DUV, UV or VIS wavelength, e.g. 193 nm. The detection light 3 may be coherent and/or may be partially coherent.

The metrology system 1 further includes a structured mask 4 with a mask pattern 5. The mask pattern 5 has absorbing pattern regions 5a which absorb the detection light 3 and transmitting pattern regions 5b which transmit the detection light 3. Together with the light source 2, the structured mask 4 produces a detection pattern 6 which causes a light structure of the detection light 3 being structured at least along one dimension (1D). In FIG. 1, such dimension along which the detection light 3 is structured via the mask pattern 5 is the x-direction.

In the embodiment of FIG. 1, the detection pattern 6 is provided via the mask pattern 5 of the structured mask 4. In that respect, the mask pattern 5 of the mask 4 is a model of the detection pattern 6. In an alternative embodiment of the metrology system 1, the detection pattern 6 is produced via a structured illumination of the sample with the detection light 3. To achieve such structured illumination, a condenser lens may be provided in the beam path between the lights source 2 and the detection pattern 6.

Further, the metrology system 1 includes a sample stage 7 to move a sample 8, i.e. the lithographic sample to be inspected, which is held with the sample stage 7 relative to the detection pattern 6. The sample stage 7 includes a stage drive to scan the sample along the x-direction which is visualized in FIG. 1 by a scanning arrow S.

Further, the metrology system 1 has a detector 9. Such detector 9 may be a single pixel detector, a sensor pixel array extending at least in one dimension, i.e. a sensor pixel column, or a two-dimensional sensor pixel array. The detector 9 may be realized by at least one photodiode or by a CMOS or CCD sensor array.

A detection optics 10 which in FIG. 1 exemplified is shown as a single condenser lens integrates a detection light intensity resulting from illuminating the sample 8 through the detection pattern 6. The detection optics 10 collects the detection light 3 which is reflected from the sample 8.

In an alternative embodiment, the detection optics 10 is designed to image the sample 8 to the detector 9, i.e. in an image plane 12.

The detection light path between the detection pattern 6 and the detector 9 is aligned such that the detector 9 is aligned normal, i.e. distant in z-direction to an x- and/or to an xy-extension of the light structure caused by the detection pattern 6.

Further, the metrology system 1 has a decoding module 11 to detect a defect localization on the sample 8 by a correlation using the detection result and further using a complementary pattern. Such decoding module 11 is in signal connection to the detector 9 and also to the sample stage 7.

The detection pattern 6 has a good correlation property with the complementary pattern which is used during the detection by the decoding module 11.

Figure 2:
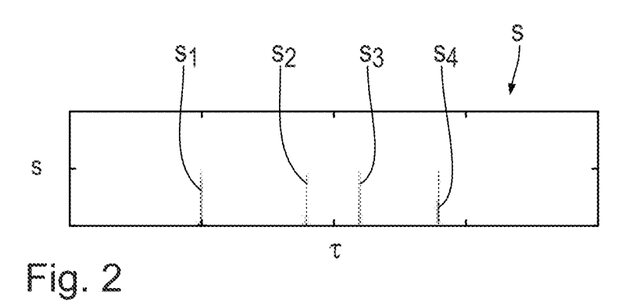
FIG. 2 a diagram showing the dependence of an ideal difference signal from a scanned position showing four defects of an exemplified defect pattern on a lithographic mask sample.

The detection method performed by the metrology system 1 now is described with use of FIG. 2 et seqq.

During the detection method, the detection pattern 6 is provided and aligned as shown e.g. in FIG. 1 and a complementary pattern is provided which has a 1D structure which is complementary to that of the detection pattern 6. Examples of such detection patterns 6, P and of complementary patterns $\tilde{P}$ are described below with reference to FIGS. 7 to 12.

The sample 8 is scanned, i.e. is moved relative to the detection pattern 6 in the x-direction while gathering the detection light 3 on the detector 9. The resulting intensity I during such scanning operation can be represented by the following equation:

$$I(\tau) = \{P(x), O(x-\tau)\} + N(\tau) = P*O + N \quad (1)$$

Here:
τ represents the scanning shift, i.e. the respective relative position between the sample 8 and mask 4 along the scan direction x, i.e. the scanning shift between the structured mask 4 and the sample 8,
P(x) represents the detection pattern 6,
O(x−τ) represents the sample pattern which may include at least one defect,
N(τ) represents a noise value.
P*O represents the scanning convolution between the detection pattern 6 and the sample 8.

FIG. 2 shows an example for a defect distribution s to be detected on the sample 8. Shown is the respective scan position τ of the respective defect $s_i$ (i=1 to 4). In total, the defect distribution s shown in FIG. 2 has four defects $s_1$, $s_2$, $s_3$ and $s_4$.

The scanning shift τ can be realized as an aperiodic shift, i.e. the detection pattern 6 is scanned over the sample 8 once and outside the detection pattern 6 there is zero intensity. Alternatively, the scanning shift may be realized as a periodic shift, i.e. the scan intensities outside the sample 8 are used as the values that are obtained during the scan of the sample 8 giving a periodic detection result. Such periodic shift is advantageous since periodic correlation properties of the illumination pattern I(τ) are better controllable than aperiodic properties.

A difference between I(τ) measured as mentioned above and a further measured reference scan intensity $I_0(\tau)$ measured with a reference sample showing a sparse defect distribution, i.e. no defects or negligible defects, gives:

$$I - I_0 = P*(O - O_0) + (N - N_0) = P*s + \tilde{N} \quad (2)$$

Here:
$O_0$ denotes the reference sample pattern,
$N_0$ denotes the noise during the reference scan,
s is the distribution of defects, i.e. the difference between the sample 8 to be measured, O and the reference sample $O_0$ without or with negligible defects, $\tilde{N}$ is the difference between the noise measured in the sample scan (equation (1)) and the noise $N_0$ measured in the reference scan.

In effect, after having scanned the sample 8 relative to the detection pattern 6 giving I(τ), the reference sample is scanned relative to the detection pattern 6 while again gathering the detection light 3 on the detector 9. During this, the sample 8 is replaced by the reference sample on the sample stage 7. The reference sample may have no defects or negligible defects.

Figure 3:
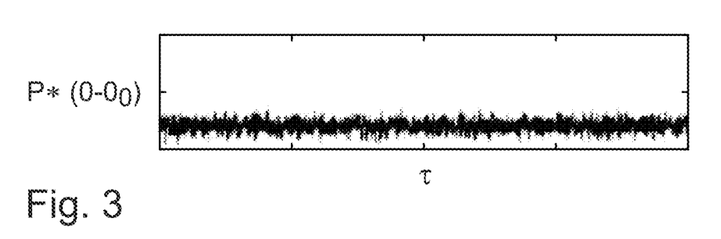
FIG. 3 in a diagram similar to FIG. 2 the dependence of a coded difference signal on the scan position which would be measured by a single pixel detector of the metrology system without noise, a detection pattern being used for signal coding.

FIG. 3 shows the coded difference signal $I-I_0$, i.e. $P*(O-O_0)$ of equation (2) above.

Figure 4:
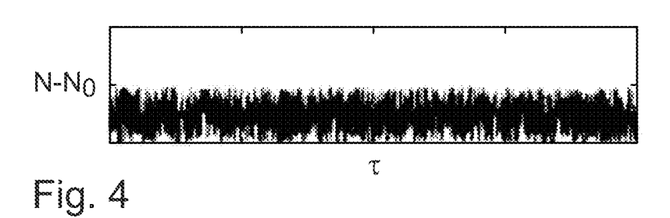
FIG. 4 in a diagram similar to FIG. 2 the dependence of an added noise signal on the scan position, the added noise signal being larger than the coded difference signal shown in FIG. 3.

FIG. 4 shows the added noise signal, i.e. the term $N-N_0$ of the equation (2) above.

Figure 5:
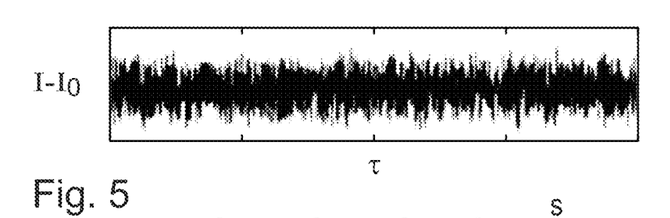
FIG. 5 in a diagram similar to FIG. 2 the dependence of the added signals according to FIGS. 3 and 4 on the scan position.

FIG. 5 shows the addition of the signals of FIGS. 3 and 4, i.e. the signal $I-I_0$ according to equation (2) above.

By help of the measurement results represented by equations (1) and (2) above, a defect localization on the sample 8 can be decoded during the defect detection method by a correlation using the complementary pattern. This is done by convolving the intensity difference result given above in equation (2) with the complementary pattern:

$$I_{Det} = \{\tilde{P}, P*s + \tilde{N}\} = \tilde{P}*P*s + \tilde{P}*\tilde{N} \cong s + \varepsilon \quad (3)$$

Here:
$I_{Det}$ is the decoded signal obtained by convolution of the measured data $P*s + \tilde{N}$ with the complementary pattern $\tilde{P}$.

Figure 6:
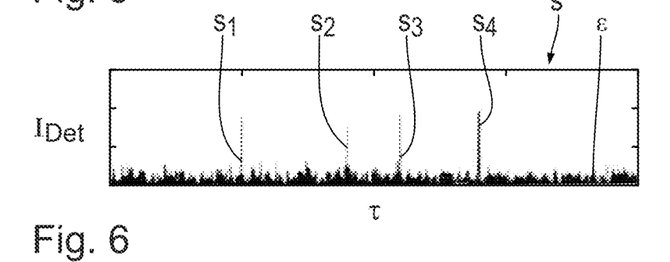
FIG. 6 in a diagram similar to FIG. 2 the dependence of a recovered/decoded signal on the scan position, the recovered signal being generated by convolving the signal according to FIG. 5 with a complementary pattern using a defect detection method which can be performed with the metrology system.

FIG. 6 shows the result after the decoding step, i.e. after convolving the signal according to FIG. 5 with the complementary pattern $\tilde{P}$ according to equation (3) above. Such signal $I_{Det}$ is an addition of the defect distribution s with the convolved noise $\varepsilon = \tilde{P}*\tilde{N}$.

The four defects $s_1$ to $s_4$ are clearly visible and show a good signal to noise ration above the residual noise ε.

Figure 7:
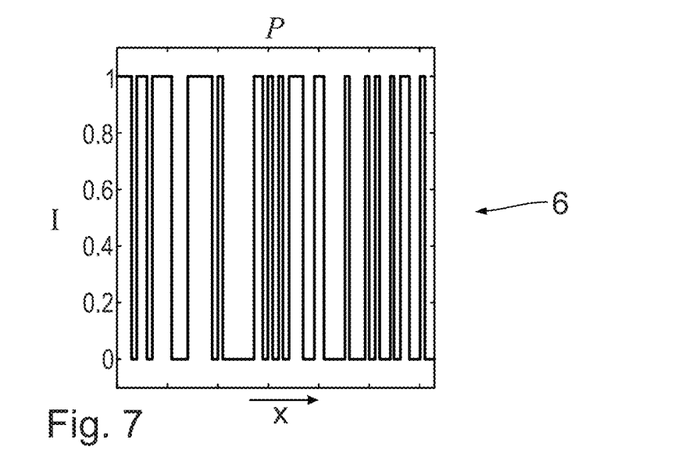
FIG. 7 an example for a 1D pattern structure used to provide the detection pattern, shown as an intensity I dependence along a coordinate x.

FIG. 7 shows an example for a detection pattern P, i.e. an example for the detection pattern 6 given by the mask pattern 5 of the structured mask 4. Shown is the pattern structure as intensity I over the x-coordinate. The pattern P switches in an almost digital manner between values 1 (ideal absorption of the detection lights 3) and 0 (ideal transmission of the detection light 3). The overall structure of the detection pattern 6 shown in FIG. 7 is similar to a barcode.

Figure 8:
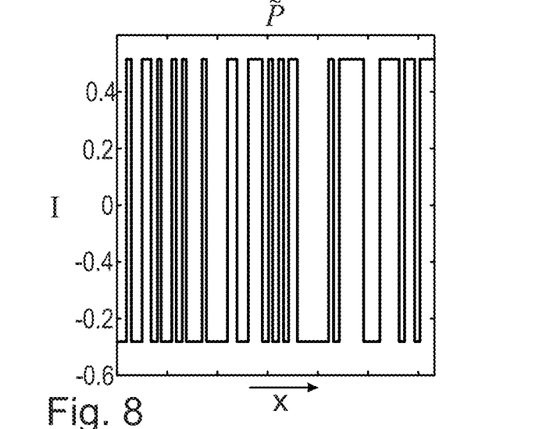
FIG. 8 a 1D pattern structure which is complementary to that of FIG. 7 which can be used as the complementary pattern, also shown in an I/x diagram.

FIG. 8 shows the complementary pattern $\tilde{P}$ which is used in the decoding step according to equation (3) above. The complementary pattern $\tilde{P}$ when seen along the coordinate x is exactly mirror symmetrical to the pattern P. Further embodiments of the complementary pattern are possible, which are not mirror symmetrical to the pattern P.

Figure 9:
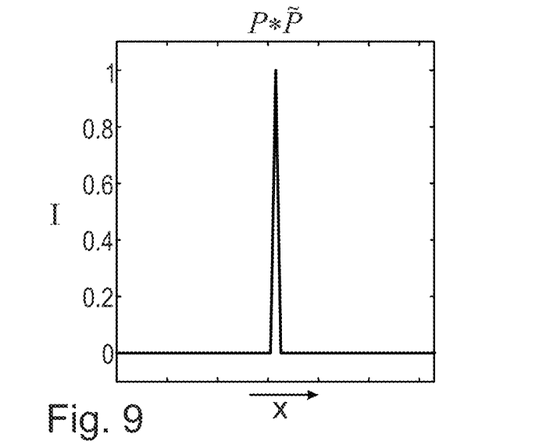
FIG. 9 the outcome of a convolution between the structures shown in FIGS. 7 and 8.

FIG. 9 shows the result of the convolution $P*\tilde{P}$. Due to the good correlation property of $\tilde{P}$ and P, their convolution gives at least approximately a delta function leaving the defect distribution s as a result as given in equation (3) above.

As an addition in equation (3), the convolution of the complementary pattern with the noise results, i.e. $\tilde{P}*\tilde{N}$. Since the complementary pattern $\tilde{P}$ and the noise signal $\tilde{N}$ are not correlated, the noise signal $\epsilon$ is significantly smaller than the defect distribution signal s. In other words, the defect distribution signal s is amplified with respect to the noise in the decoding step.

Such defect detection method using a detection pattern and a complementary pattern to localize defects on a sample also is possible in two dimensions (2D).

Figure 10:
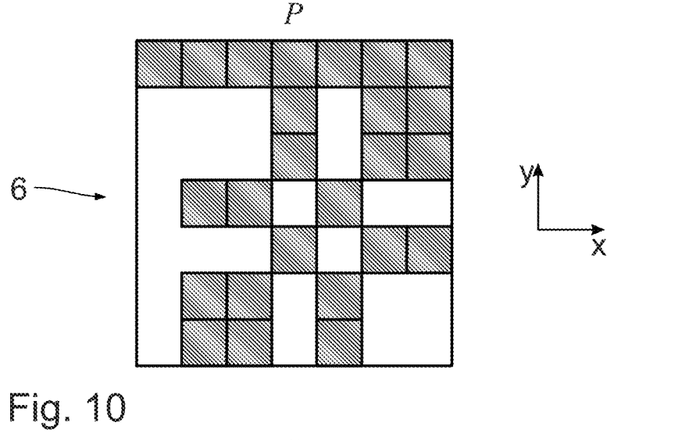
FIGS. 10 to 12 similar to FIGS. 7 to 9 a 2D pattern structure (FIG. 10), a 2D complementary pattern structure (FIG. 11) and a convolution result (FIG. 12), each in a top view.

FIG. 10 shows an example for a detection pattern P, i.e. for a detection pattern 6 resulting from respective mask pattern 5 of a 2D structured mask 4 in two dimensions xy.

Figure 11:
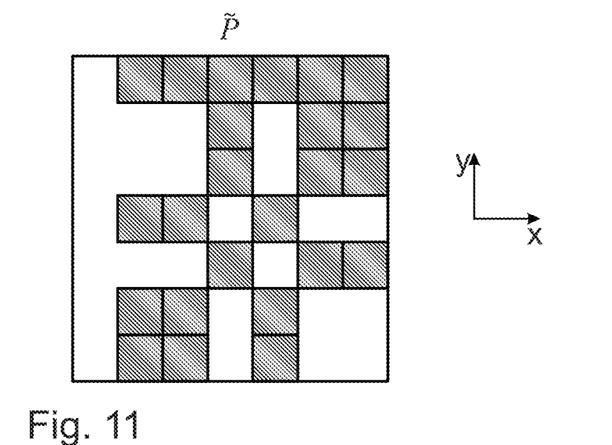

FIG. 11 shows the complementary pattern $\tilde{P}$ complementary to the detection pattern P of FIG. 10.

Figure 12:
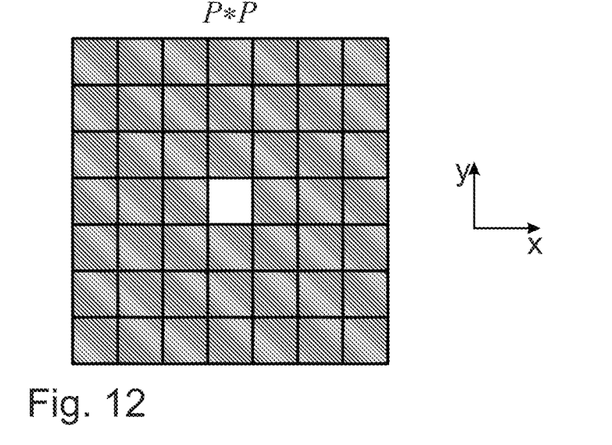

FIG. 12 shows the convolution result $P*\tilde{P}$, i.e. the convolution of the two-dimensional detection pattern P of FIG. 10 and its complementary pattern $\tilde{P}$ of FIG. 11.

Further examples for such two-dimensional patterns can be found in A. Busboom et al. Experimental Astronomy 8: 97-123, 1998.

Performing the defect detection method in two dimensions requires scanning/moving the sample 8 relative to the detection pattern 6 of FIG. 10 in the two dimensions x and y, e.g. linewise along x with increments in y or vice versa, while gathering the detection light $I(\tau x, \tau y)$ assigned to the respective scanning coordinates in x and y.

Alternatively, such two-dimensional scanning can be performed in a single x scanning step by using an array detector 9 having a sensor pixel array extending in the y-direction, i.e. at least one pixel row.

During the signal processing of the defect detection method, a matched filter is obtained by correlating the complementary pattern $\tilde{P}$ with an unknown signal, i.e. the scanned intensity measured in equation (1) above, to detect the presence of a detection pattern P in the unknown signal. In that sense, the decoding step uses a filtering algorithm. This is equivalent to convolving the unknown signal with a conjugate time-reversed version of the pattern. $\tilde{P}$ and P need to be assigned such that their convolution approximates a delta distribution as close as possible. Such approximation is possible via a ratio between a peak signal and a background signal of such convolution. Such ratio should approach infinity, i.e. should be larger than $10^3$ or larger than $10^4$ or larger than $10^5$ or even larger.

The detector defect distribution s on the sample 8 then can be further evaluated to qualify the sample 8. Samples that pass such qualification step then can be further used in the lithography process to produce semiconductor structures, in particular memory chips or ASIC chips.

In some implementations, the decoding module, or a computer for performing various computations described in this document, such as the evaluation of the detector defect distribution, the decoding of the defect localization, the implementation of the filtering algorithm, can include one or more data processors for processing data, one or more storage devices for storing data, such as one or more databases, and/or one or more computer programs including instructions that when executed by the decoding module or the computer causes the decoding module or the computer to carry out the processes. The decoding module or the computer can include one or more input devices, such as a keyboard, a mouse, a touchpad, and/or a voice command input module, and one or more output devices, such as a display, and/or an audio speaker.

In some implementations, the decoding module or the computer can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the decoding module or the computer can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. The dependent claims listed below recite various features of the invention. Various combinations of the features recited in multiple dependent claims are also within the scope of the invention.

What is claimed is:

1. A method to detect a defect on a lithographic sample with the following steps:

providing detection light and a detector with at least one sensor pixel, providing a detection pattern (P) causing a light structure of the detection light being structured at least along a first dimension, aligning the detection pattern (P) such that the detector is aligned normal to a two-dimensional extension of the light structure, providing a complementary pattern (P̃) which has a one-dimensional structure which is complementary to that of the detection pattern (P), moving the sample relative to the detection pattern (P) while gathering the detection light on the detector, providing a reference sample without defects or with negligible defects, moving the reference sample relative to the detection pattern (P) while gathering the detection light on the detector, decoding a defect localization on the sample by correlation using the complementary pattern (P̃).

2. The method according to claim 1, wherein the decoding step is done using a filtering algorithm by correlating the complementary pattern (P̃) with a first signal representing an intensity of the detection light gathered on the detector to detect a presence of the detection pattern P in the first signal.

3. The method according to claim 1, wherein the providing of the detection pattern (P) is done via a structured mask showing a model of the detection pattern as a mask pattern having pattern areas transmitting the detection light and pattern areas blocking the detection light.

4. The method according to claim 1, wherein the providing of the detection pattern (P) is done via a structured illumination of the sample with the detection light.

5. The method according to claim 1, wherein during the moving, the sample is periodically shifted.

6. The method according to claim 1, wherein during the moving, the sample is aperiodically shifted.

7. A metrology system to perform the method according to claim 1,
having a detection light source,
having a detector with at least one sensor pixel,
having means to produce a detection pattern (P) causing a light structure of the detection light being structured at least along the first dimension,
having a sample stage to move a sample held with the sample stage relative to the detection pattern and
having a decoding module to detect a defect localization on the sample by a correlation using a complementary pattern (P̃).

8. The metrology system according to claim 7, wherein the detector has a sensor pixel array extending at least in the first dimension.

9. The metrology system according to claim 7, wherein the detection pattern is produced via the mask pattern of a structured mask.

10. The metrology system according to claim 7, wherein the detection pattern (P) is produced via a structured illumination of a sample with the detection light.

11. The method of claim 1 wherein the complementary pattern (P̃) is a mirror image of the detection pattern (P) along the first dimension.

12. The metrology system of claim 7 wherein the complementary pattern (P̃) is a mirror image of the detection pattern (P) along the first dimension.

13. The metrology system of claim 8 wherein the detection pattern is produced via the mask pattern of a structured mask.

14. The metrology system of claim 8 wherein the detection pattern (P) is produced via a structured illumination of a sample with the detection light.

15. The metrology system of claim 7 wherein the decoding step is done using a filtering algorithm by correlating the complementary pattern (P̃) with a first signal representing an intensity of the detection light gathered on the detector to detect a presence of the detection pattern P in the first signal.

16. The metrology system of claim 7 wherein the providing of the detection pattern (P) is done via a structured mask showing a model of the detection pattern as a mask pattern having pattern areas transmitting the detection light and pattern areas blocking the detection light.

17. The metrology system of claim 7 wherein the providing of the detection pattern (P) is done via a structured illumination of the sample with the detection light.

18. The metrology system of claim 7 wherein during the moving, the sample is periodically shifted.

19. The metrology system of claim 7 wherein during the moving, the sample is aperiodically shifted.

20. The method of claim 2 wherein the providing of the detection pattern (P) is done via a structured mask showing a model of the detection pattern as a mask pattern having pattern areas transmitting the detection light and pattern areas blocking the detection light.

* * * * *

UNITED STATES PATENT AND TRADEMARK OFFICE
CERTIFICATE OF CORRECTION

| | | |
|---|---|---|
| PATENT NO. | : 12,271,115 B2 | Page 1 of 1 |
| APPLICATION NO. | : 17/684913 | |
| DATED | : April 8, 2025 | |
| INVENTOR(S) | : Toufic Jabbour and Lars Omlor | |

It is certified that error appears in the above-identified patent and that said Letters Patent is hereby corrected as shown below:

On the Title Page

<u>Column 2</u>
(Abstract), Line 8, delete "complimentary" and insert -- complementary --
(Abstract), Line 9, delete "complimentary" and insert -- complementary --

In the Specification

<u>Column 1</u>
Line 55, delete "complimentary" and insert -- complementary --

<u>Column 3</u>
Line 1, delete "complimentary" and insert -- complementary --
Line 17, delete "complimentary" and insert -- complementary --

<u>Column 5</u>
Line 53, delete "value." and insert -- value, --

<u>Column 6</u>
Line 51, delete "ration" and insert -- ratio --

Signed and Sealed this
Third Day of June, 2025

Coke Morgan Stewart
*Acting Director of the United States Patent and Trademark Office*